(12) United States Patent
Ashjaee et al.

(10) Patent No.: US 9,748,926 B2
(45) Date of Patent: Aug. 29, 2017

(54) ANTENNA LNA FILTER FOR GNSS DEVICE

(71) Applicant: JAVAD GNSS, Inc., San Jose, CA (US)

(72) Inventors: Javad Ashjaee, Saratoga, CA (US); Dmitry Dubrovsky, Moscow (RU)

(73) Assignee: JAVAD GNSS, INC., San Jose, CA (US)

( * ) Notice: Subject to any disclaimer, the term of this patent is extended or adjusted under 35 U.S.C. 154(b) by 982 days.

(21) Appl. No.: 14/031,363

(22) Filed: Sep. 19, 2013

(65) Prior Publication Data

US 2014/0077865 A1   Mar. 20, 2014

Related U.S. Application Data

(60) Provisional application No. 61/703,094, filed on Sep. 19, 2012.

(51) Int. Cl.
*G01S 19/36* (2010.01)
*H03H 11/12* (2006.01)
*G01S 19/21* (2010.01)
*G01S 19/37* (2010.01)

(52) U.S. Cl.
CPC ......... *H03H 11/1239* (2013.01); *G01S 19/21* (2013.01); *G01S 19/36* (2013.01); *G01S 19/37* (2013.01); *H03F 2200/451* (2013.01)

(58) Field of Classification Search
CPC ........... H03H 11/1239; H03F 2200/451; G01S 19/36; G01S 19/37
USPC ........ 342/357.76, 357.77; 330/302, 306, 310
See application file for complete search history.

(56) References Cited

U.S. PATENT DOCUMENTS

| 5,119,509 A | 6/1992 | Kang |
| 5,596,600 A * | 1/1997 | Dimos ............ G01S 19/21 370/208 |
| 5,884,214 A * | 3/1999 | Krasner ............ G01C 21/206 701/470 |
| 5,949,372 A * | 9/1999 | Lennen ............ G01S 19/23 342/357.62 |

(Continued)

FOREIGN PATENT DOCUMENTS

| GB | 2390241 A | 12/2003 |
| WO | 2007/044652 A2 | 4/2007 |

(Continued)

OTHER PUBLICATIONS

International Preliminary Report on Patentability received for PCT Patent Application No. PCT/US2012/063981, issued on May 13, 2014, 9 pages.

(Continued)

*Primary Examiner* — Chuong P Nguyen
(74) *Attorney, Agent, or Firm* — Morrison & Foerster LLP (57) ABSTRACT

Low-noise amplifier (LNA) filters and processes for filtering global navigation satellite system (GNSS) signals are disclosed. The LNA filters can be used to down-convert a received GNSS signal to a lower frequency, filter the GNSS signal at the lower frequency, and up-convert the GNSS signal to the original frequency of the GNSS signal. The down-converted frequency can be selected based on a temperature of the GNSS signal to compensate for shifts in the frequency response of the filter due to temperature changes.

15 Claims, 7 Drawing Sheets

(56) References Cited

U.S. PATENT DOCUMENTS

| | | | |
|---|---|---|---|
| 6,784,831 B1* | 8/2004 | Wang | G01S 19/21 |
| | | | 342/357.63 |
| 6,975,847 B1 | 12/2005 | Bienek et al. | |
| 7,092,676 B2 | 8/2006 | Abdelgany et al. | |
| 8,022,868 B2 | 9/2011 | Yudanov et al. | |
| 8,130,872 B2 | 3/2012 | Brunn et al. | |
| 8,145,172 B2 | 3/2012 | Khoini-Poorfard et al. | |
| 8,217,833 B2 | 7/2012 | Webber et al. | |
| 8,587,477 B2 | 11/2013 | Samavati et al. | |
| 8,975,967 B2* | 3/2015 | Ashjaee | H03F 3/191 |
| | | | 330/302 |
| 2005/0242994 A1 | 11/2005 | Cobb et al. | |
| 2005/0259760 A1 | 11/2005 | Casabona et al. | |
| 2008/0208454 A1 | 8/2008 | Pesterev et al. | |
| 2008/0214137 A1 | 9/2008 | Qian | |
| 2009/0189804 A1 | 7/2009 | Ashjaee et al. | |
| 2011/0095943 A1* | 4/2011 | Letestu | G01S 19/32 |
| | | | 342/357.72 |
| 2012/0092212 A1* | 4/2012 | Meurer | G01S 19/23 |
| | | | 342/195 |
| 2012/0243447 A1 | 9/2012 | Weissman et al. | |
| 2013/0021934 A1 | 1/2013 | Rügamer et al. | |
| 2013/0113571 A1 | 5/2013 | Ashjaee et al. | |

FOREIGN PATENT DOCUMENTS

| | | |
|---|---|---|
| WO | 2007/044652 A3 | 11/2007 |
| WO | 2007/148261 A2 | 12/2007 |
| WO | 2007/148261 A3 | 6/2008 |
| WO | 2008/103757 A1 | 8/2008 |

OTHER PUBLICATIONS

Non-Final Office Action received for U.S. Appl. No. 13/672,329, mailed on Jun. 30, 2014, 7 pages.

International Search Report and Written Opinion received for PCT Application No. PCT/US2012/063981, mailed on Feb. 27, 2013, 12 pages.

International Search Report and Written Opinion received for PCT Patent Application No. PCT/US2013/060434, mailed on Jan. 9, 2014, 9 pages.

Barnes et al., "An Overview of Microwave Component Requirements for Future Space Applications", 2005, 8 pages.

Miyashita, Kiyoshi, "A Plastic Packaged Ku-Band LNB with Very High Susceptibility to Supply PLL in 0.18um CMOS", SiRF, 2010. pp. 188-191.

\* cited by examiner

ANTENNA LNA FILTER FOR GNSS DEVICE

CROSS-REFERENCE TO RELATED APPLICATIONS

This application claims priority to U.S. Provisional Application No. 61/703,094 filed with the U.S. Patent and Trademark Office on Sep. 19, 2012, the entire contents of which are hereby incorporated by reference.

BACKGROUND

1. Field

The present disclosure relates generally to low-noise amplifier (LNA) filters and, more specifically, to LNA filters for global navigation satellite system (GNSS) devices.

2. Description of Related Art

Navigation receivers that use GNSS, such as GPS or GLONASS (hereinafter collectively referred to as "GNSS"), enable a highly accurate determination of the position of the receiver. The satellite signals may comprise carrier harmonic signals that are modulated by pseudo-random binary codes and which, on the receive side, may be used to measure the delay relative to a local reference clock. These delay measurements are used to determine the pseudo-ranges between the receiver and the satellites. The pseudo-ranges are not true geometric ranges because the receiver's local clock is different from the satellite onboard clocks. If the number of satellites in sight is greater than or equal to four, then the measured pseudo-ranges can be processed to determine the user's single point location as represented by a vector, as well as to compensate for the receiver clock offset.

A more detailed description of determining a position based on signals from GNSS satellites and base stations is available in U.S. patent application Ser. No. 12/070,333, filed Feb. 15, 2008, published as US Patent Publication No. 2008/0208454 and Ser. No. 12/360,808, filed Jan. 27, 2009, published as US Patent Publication No. 2009/0189804 assigned to the assignee of the present disclosure, and each of which are incorporated herein by reference in their entirety for all purposes.

Positioning accuracy of GNSS technology is directly dependent on the accuracy of the delay measurements. Transmissions from devices operating at non-GNSS frequencies that are near GNSS frequencies can cause degraded performance of GNSS services, such as less positional accuracy, by interfering with the delay measurements.

For example, a GPS-based GNSS device may use timing information transmitted on the L1 band from 1563.42 MHz to 1587.42 MHz. Without filtering, transmissions from the next lower band from 1525 MHz to 1559 MHz could interfere with accurate measurement of the timing signals in the L1 band. Many GPS-based devices employ antenna LNA filters to remove the unwanted frequencies in bands outside of the L1 band. However, many of these GPS-based devices were designed with filters built based on assumptions about the signal strength of the transmissions in the 1525 MHz to 1559 MHz band. Specifically, as this portion of the spectrum was originally designated for satellite transmission, filters for some GPS-based devices assumed weak signal strengths for transmission in this spectrum. This assumption may no longer be accurate. For example, LightSquared is a wireless broadband company that is proposing to use the above frequency spectrum, which is just below the L1 band, to provide a nationwide high-speed wireless network. As discussed above, this spectrum was previously assigned for satellite based communication. Accordingly, many GPS-based devices were designed to only filter out inferences from this neighboring spectrum based on relatively weak signals that are transmitted from space. However, part of LightSquared's network may involve ground based transmissions that are many orders of magnitude stronger than those that originate in space.

Additionally, the frequency response of a filter is typically temperature dependent. As a result, due to changes in temperature, conventional filters may not be capable of adequately filtering signals in a neighboring spectrum. Thus, improved GNSS antenna filters are desired.

BRIEF SUMMARY

LNA filters and processes for filtering GNSS signals are disclosed. The LNA filters can be used to down-convert a received GNSS signal to a lower frequency, filter the GNSS signal at the lower frequency, and up-convert the GNSS signal to the original frequency of the GNSS signal. The down-converted frequency can be selected based on a temperature of the GNSS signal to compensate for shifts in the frequency response of the filter due to temperature changes.

DETAILED DESCRIPTION

The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Figure 1:
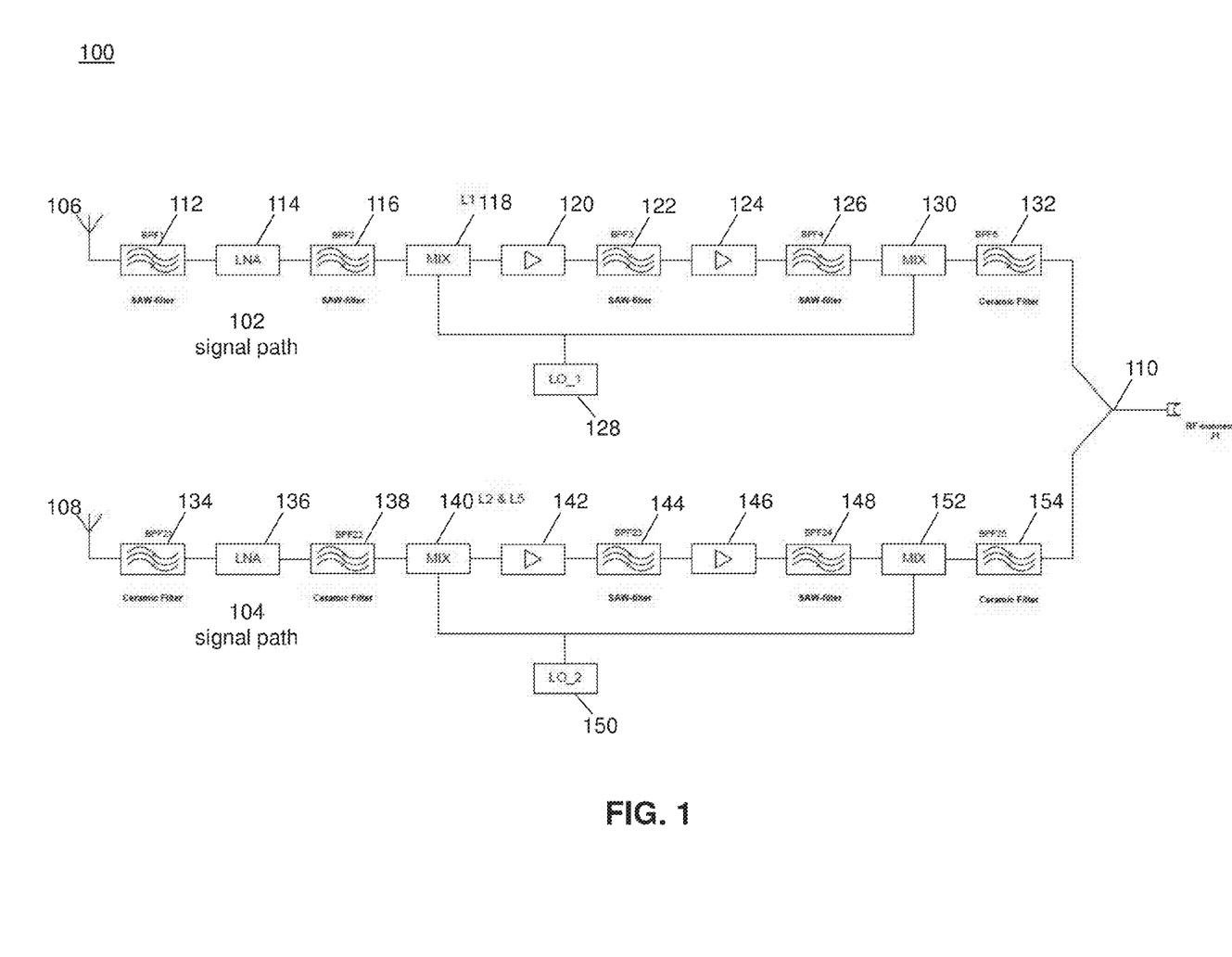
FIG. 1 illustrates a block diagram of a first antenna LNA filter for use with a GNSS device according to examples of the present disclosure.

FIG. 1 depicts a first LNA antenna filter 100 having two signal paths: signal path 102 and signal path 104. Signal path 102 is electrically coupled to antenna 106, and signal path 104 is electrically coupled to antenna 108.

Signal path 102 may be configured to receive GNSS signals on the L1 band (1563.42 MHz to 1587.42 MHz) whereas signal path 104 may be configured to receive GNSS signals on the L2 band (1215.6 to 1239.6 MHz) and/or L5 band (1164-1215 MHz). Signal path 102 and signal path 104 may couple together at junction 110, which may be coupled to a receiver for extracting and processing the information contained in the GNSS signals.

For ease of discussion, signal paths 102 and 104 will be explained with respect to three cascaded stages. However, division of signal paths 102 and 104 in this manner should not be construed as limiting on the scope of the claims.

Signal path 102 may include a first stage for initially filtering a GNSS signal received at antenna 106. The first stage can include LNA 114 and filters 112 and 116. Filter 112 can be configured to filter an incoming GNSS signal received at antenna 106 by rejecting at least a portion of the signal outside of the L1 band. In some examples, filter 112 can be implemented using a surface acoustic wave (SAW) filter. The signal filtered by filter 112 can then be received by LNA 114. LNA 114 can be configured to maximize or increase the amplification of the received GNSS signal while minimizing or reducing the amount of noise introduced into the amplified signal. The signal amplified by LNA 114 can then be received by filter 116. Filter 116 can be configured to further filter the amplified signal received from LNA 114 by rejecting at least a portion of the signal outside of the L1 band. In some examples, filter 116 can be implemented using a SAW filter.

Signal path 102 can further include a second stage for down-converting and filtering the GNSS signal filtered by the first stage. The second stage can include mixer (MIX) 118, filters 122 and 126, intermediate frequency amplifiers (IFAs) 120 and 124, and local oscillator (LO) 128. LO 128 may include one or more oscillators and some or all of the oscillators may be adjustable oscillators operable to output clock signals with variable frequencies. MIX 118 can be configured to down-convert the frequency of the signal received from filter 116 to a lower frequency (e.g., 280±20 MHz) using a clock signal received from LO 128. IFA 120 can be coupled to receive the down-converted signal from MIX 118 and configured to amplify the received signal. Filter 122 can be coupled to receive the amplified signal from IFA 120 and configured to filter the signal by rejecting at least a portion of the signal outside of a frequency range corresponding to the L1 band (e.g., a frequency range that corresponds to the L1 band after being down-converted by MIX 118). In some examples, filter 122 can include a SAW filter. A second IFA 124 can be coupled to receive the filtered signal from filter 122 and configured to amplify the received signal. Filter 126 can be coupled to receive the amplified signal from IFA 124 and configured to further filter the signal by rejecting at least a portion of the signal outside of a frequency range corresponding to the L1 band (e.g., a frequency range that corresponds to the L1 band after being down-converted by MIX 118). In some examples, filter 126 can include a SAW filter.

Signal path 102 can further include a third stage for up-converting and filtering the GNSS signal down-converted and filtered by the second stage. The third stage can include MIX 130 and filter 132. MIX 130 can be configured to up-convert the frequency of the signal received from filter 126 to the frequency of the GNSS signal received at antenna 106 (e.g., the frequency of the signal prior to being down-converted at MIX 118) or a different frequency using a clock signal received from an oscillator, such as LO 128 or a different oscillator. Filter 132 can be coupled to receive the up-converted signal from MIX 130 and can be configured to filter the up-converted signal by rejecting at least a portion of the signal outside of the L1 band. Filter 132 can be implemented with, for example, a ceramic filter.

Similarly, signal path 104 may include a first stage for initially filtering a GNSS signal received at antenna 108. The first stage can include LNA 136 and filters 134 and 138. Filter 134 can be configured to filter an incoming GNSS signal received at antenna 108 by rejecting at least a portion of the signal outside of the L2 and/or L5 band(s). In some examples, filter 134 can be implemented using a ceramic filter. The signal filtered by filter 134 can then be received by LNA 136. LNA 136 can be configured to maximize or increase the amplification of the received GNSS signals while minimizing or reducing the amount of noise introduced into the amplified signal. The signal amplified by LNA 136 can then be received by filter 138. Filter 138 can be configured to further filter the amplified signal received from LNA 136 by rejecting at least a portion of the signal outside of the L2 and/or L5 band(s). In some examples, filter 138 can be implemented using a ceramic filter.

Signal path 104 can further include a second stage for down-converting and filtering the GNSS signal filtered by the first stage. The second stage can include MIX 140, filters 144 and 148, IFAs 142 and 146, and LO 150. MIX 140 can be configured to down-convert the frequency of the signal received from filter 138 to a lower frequency (e.g., 225±45 MHz) using a clock signal received from LO 150. LO 150 may include one or more oscillators and some or all of the oscillators may be adjustable oscillators operable to output clock signals with variable frequencies. IFA 142 can be coupled to receive the down-converted signal from MIX 140 and configured to amplify the received signal. Filter 144 can be coupled to receive the amplified signal from IFA 142 and configured to filter the signal by rejecting at least a portion of the signal outside of a frequency range corresponding to the L2 and/or L5 band(s) (e.g., frequency range(s) that corresponds to the L2 and/or L5 band(s) after being down-converted by MIX 140). In some examples, filter 144 can include a SAW filter. A second IFA 146 can be coupled to receive the filtered signal from filter 144 and configured to amplify the received signal. Filter 148 can be coupled to receive the amplified signal from IFA 146 and configured to further filter the signal by rejecting at least a portion of the signal outside of a frequency range corresponding to the L2 and/or L5 band(s) (e.g., a frequency range that corresponds to the L2 and/or L5 band(s) after being down-converted by MIX 140). In some examples, filter 148 can include a SAW filter.

Signal path 104 can further include a third stage for up-converting and filtering the GNSS signal down-converted and filtered by the second stage. The third stage can include MIX 152 and filter 154. MIX 152 can be configured to up-convert the frequency of the signal received from filter 148 to the frequency of the GNSS signal received at antenna 108 (e.g., the frequency of the signal prior to being down-converted at MIX 140) or a different frequency using a clock signal received from LO 150. Filter 154 can be coupled to receive the up-converted signal from MIX 152 and can be configured to filter the up-converted signal by rejecting at least a portion of the signal outside of the L2 and/or L5 band(s). Filter 154 can be implemented with, for example, a ceramic filter.

Antenna LNA filter 100 can advantageously down-convert GNSS signals to a lower frequency and filter those signals at the lower frequency. This results in improved signal filtering, as filtering can be easier and performed more effectively at lower frequencies. Additionally, LNA filter 100 can advantageously up-convert the filtered signal to the original frequency of the received GNSS signal (rather than some other intermediate frequency), allowing antenna LNA filter 100 to be used with receivers configured to receive GNSS signals from the antenna (and thus at the original GNSS signal frequency).

Figure 2:
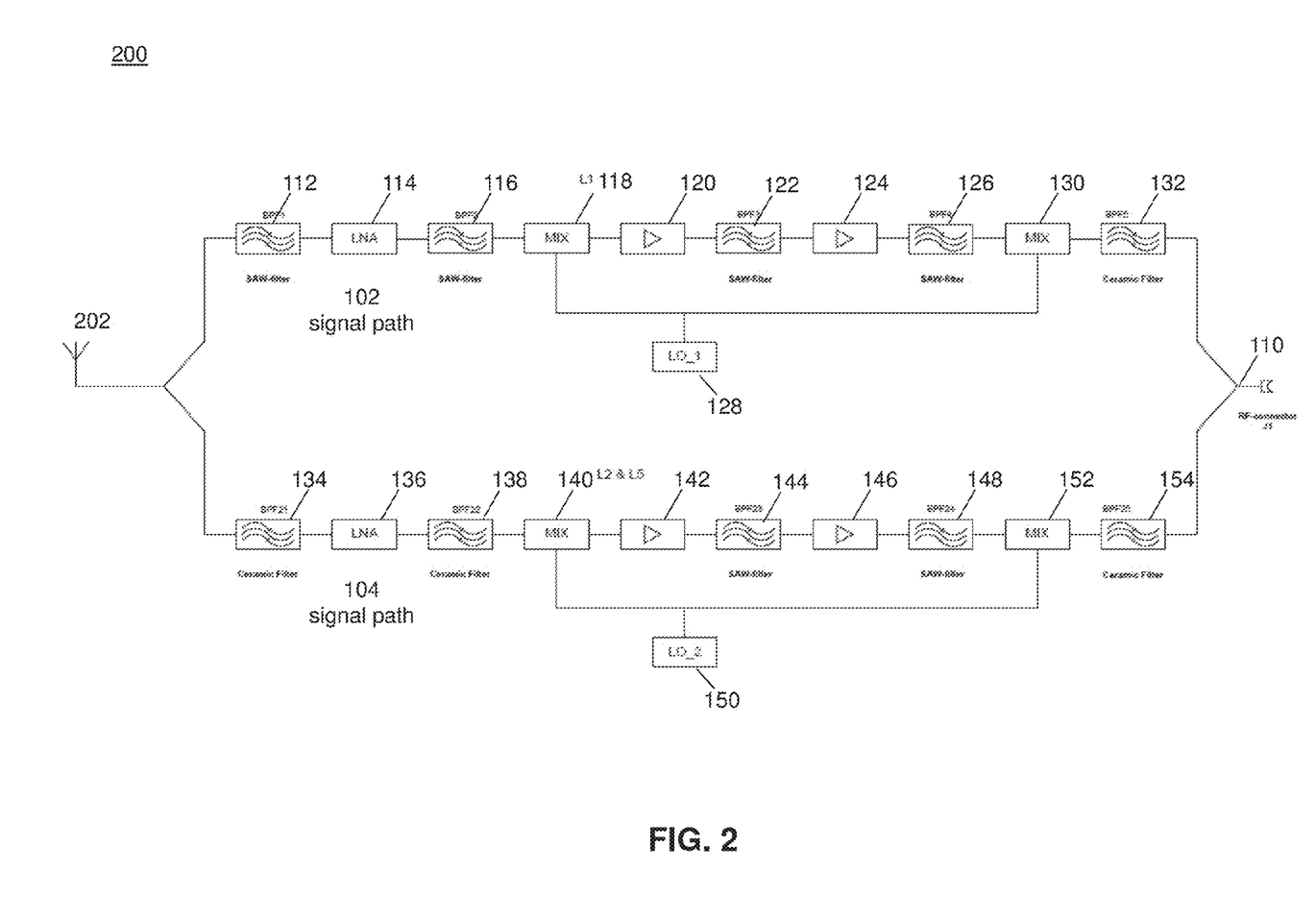
FIG. 2 illustrates a block diagram of a second antenna LNA filter for use with a GNSS device according to examples of the present disclosure.

FIG. 2 depicts a second antenna LNA filter 200. Antenna LNA filter 200 is similar to antenna LNA filter 100, except that separate antennas 106 and 108 are replaced with antenna 202. Thus, both signal paths 102 and 104 may receive GNSS signals on their respective bands from the same antenna. The remaining portions of antenna LNA filter 200 may operate in a manner similar to that of antenna LNA filter 100.

While FIGS. 1 and 2 depict the components of the respective antenna LNA filter as being directly coupled to each other, it should be understood that the examples are not limited in this manner. Rather, those skilled in the art will understand that additional components, such as matching networks and bias circuits may be used for the antenna LNA filters depicted in FIGS. 1 and 2. Moreover, the depiction of the various components of the above described antenna LNA filters should not be construed to mean that each component must be in a separate package. For example, multiple filters can be packaged together. As another example, one or more filters can be packaged with one or more LNAs.

Figure 3:
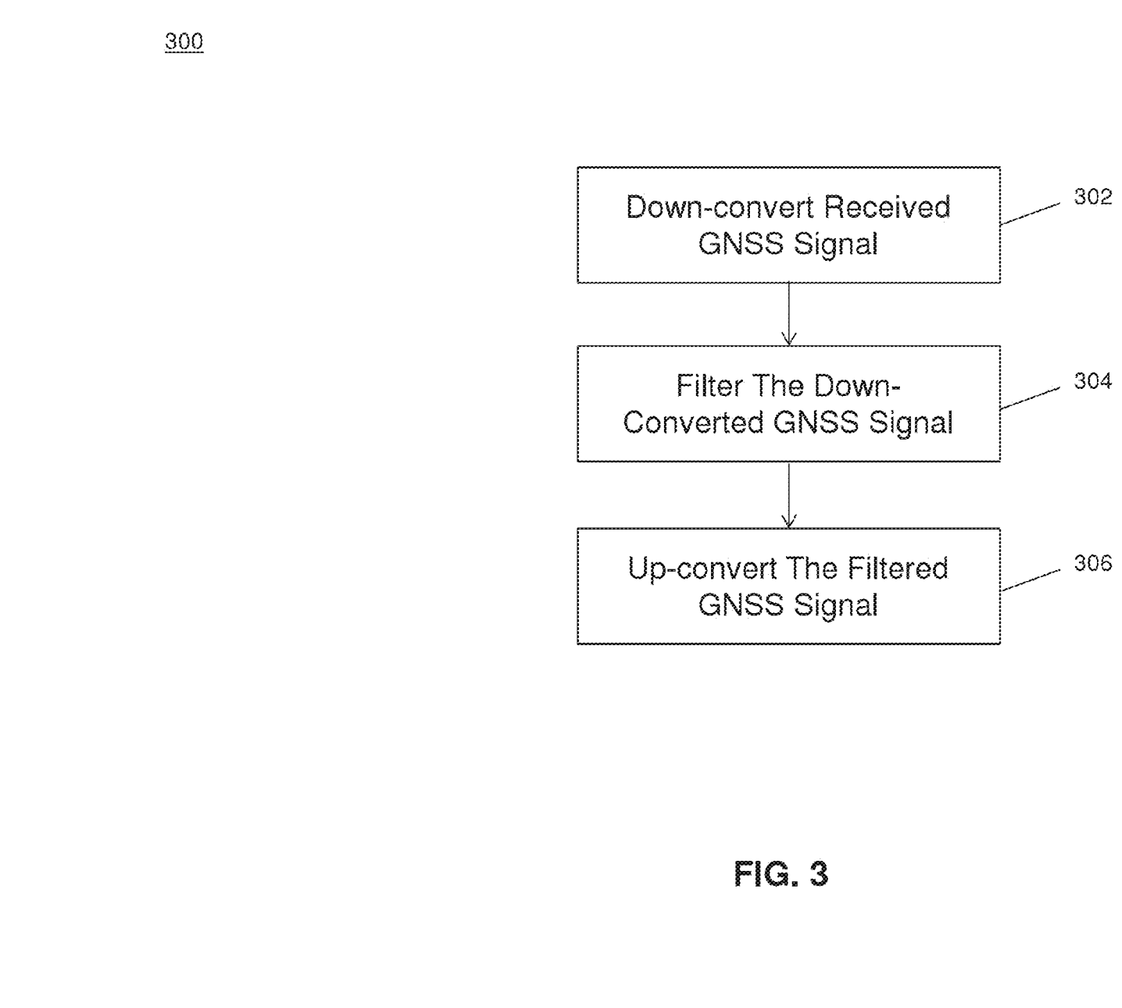
FIG. 3 illustrates an example process for filtering a GNSS signal according to various examples.

FIG. 3 illustrates an example process 300 that can be used to filter a GNSS signal. Process 300 can be performed using a filter similar or identical to antenna LNA filters 100 or 200. At block 302, a received GNSS signal can be down-converted to a lower frequency. For example, a GNSS signal can be received at an antenna similar or identical to antennas 106, 108, or 202. The GNSS signal can contain position information in one or more signal bands, such as L1, L2, or L5 bands. This received GNSS signal can be down-converted to a lower frequency using mixing circuitry similar or identical to MIX 118 or 140. In some examples, prior to being down-converted, the received GNSS signal can be filtered using filter circuitry similar or identical to LNA 114 and filters 112 and 116 or LNA 136 and filters 134 and 138.

At block 304, the signal down-converted at block 302 can be filtered. In some examples, the filtering can be performed using circuitry similar or identical to IFAs 120 and 124 and filters 122 and 126 or IFAs 142 and 146 and filters 144 and 148. The filtering can be performed by rejecting at least a portion of the signal outside of a frequency range corresponding to a desired band (e.g., a frequency range that corresponds to the L1, L2, or L5 band after being down-converted at block 302.) In other words, the down-converted signal can be filtered in a way such that if up-converted back to the original frequency, the filtering rejects portions of the signal outside of the desired band (e.g., L1, L2, or L5 band).

At block 306, the down-concerted signal that was filtered at block 304 can be up-converted. In some examples, the signal can be up-converted to the frequency of the original received signal (or within an acceptable tolerance, such as within 1 Hz. The signal can be up-converted using circuitry similar or identical to MIX 130 or 152. In some examples, after being up-converted, the GNSS signal can be further filtered using a filter similar or identical to filters 132 or 154.

Using process 300 described above, a received GNSS signal can advantageously be down-converted to a lower frequency where it can be filtered more effectively than at its original, higher frequency. Additionally, by up-converting the filtered signal to the original frequency of the received GNSS signal (rather than some other intermediate frequency), the process can be used with GNSS receivers that are configured to receive GNSS signals from an antenna (and thus at the original GNSS signal frequency).

Figure 4:
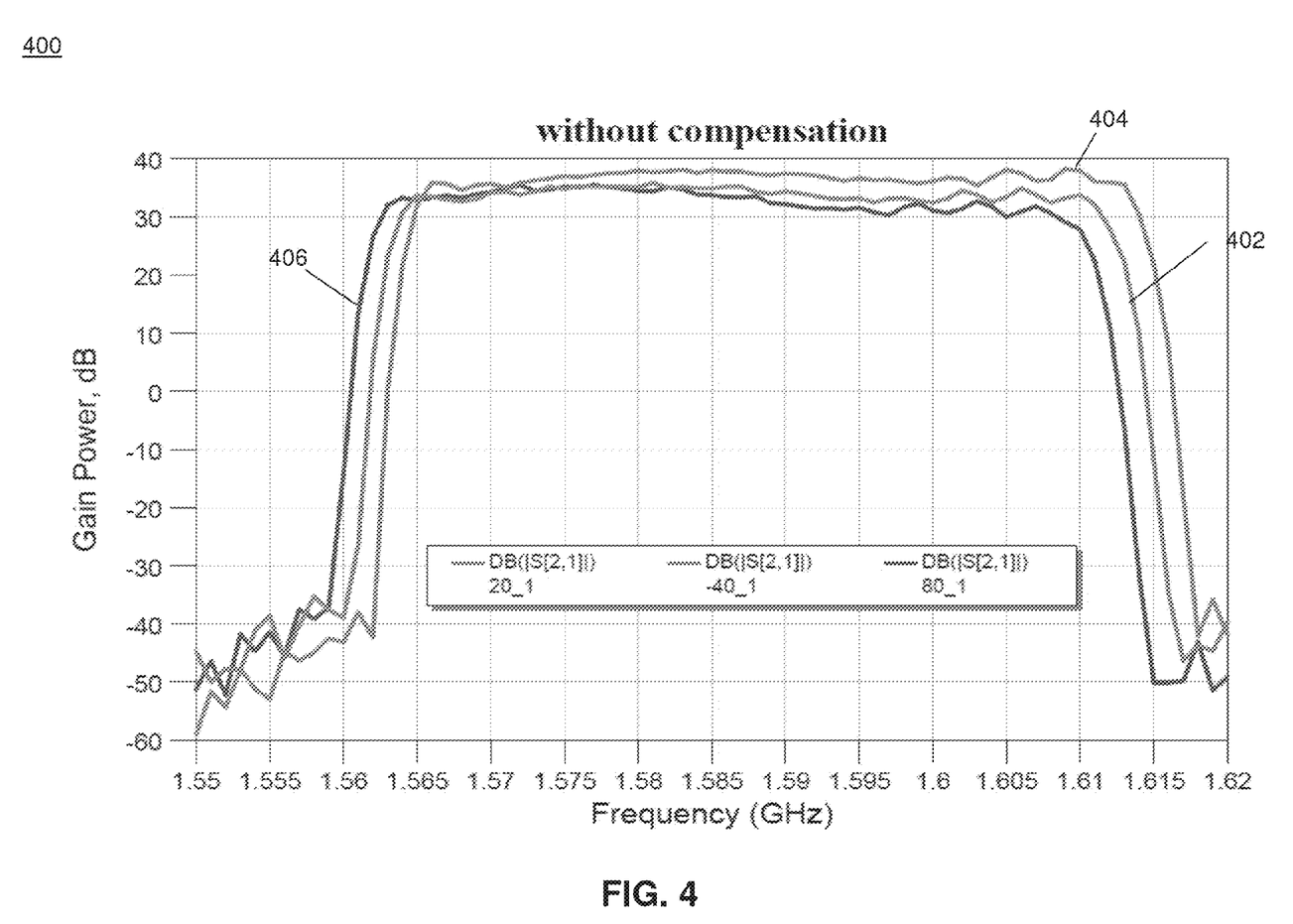
FIG. 4 is a graph showing the frequency response of an LNA filter at various temperatures.

The frequency response of filters, such as antenna LNA filters 100 and 200 (or the individual filters used within antenna LNA filters 100 and 200), can be temperature dependent. In other words, changes in temperature can affect a filter's ability to properly filter signals outside of a desired band of frequencies. For example, FIG. 4 illustrates a graph 400 showing the variability of the frequency response of an example filter at three different temperatures. In particular, curve 402 represents the frequency response of the filter at 20° C., curve 404 represents the frequency response of the filter at −40° C., and curve 406 represents the frequency response of the filter at 80° C. As can be seen, the frequency response of the filter can be shifted based on the operating temperature of the filter. This can be problematic when attempting to filter signals in a neighboring band, as the shift in frequency can prevent the filter from rejecting signals outside of a desired band of frequencies (e.g., by shifting the protected region to include signals that would otherwise be included in the cut-off regions at normal operating temperatures).

Figure 5:
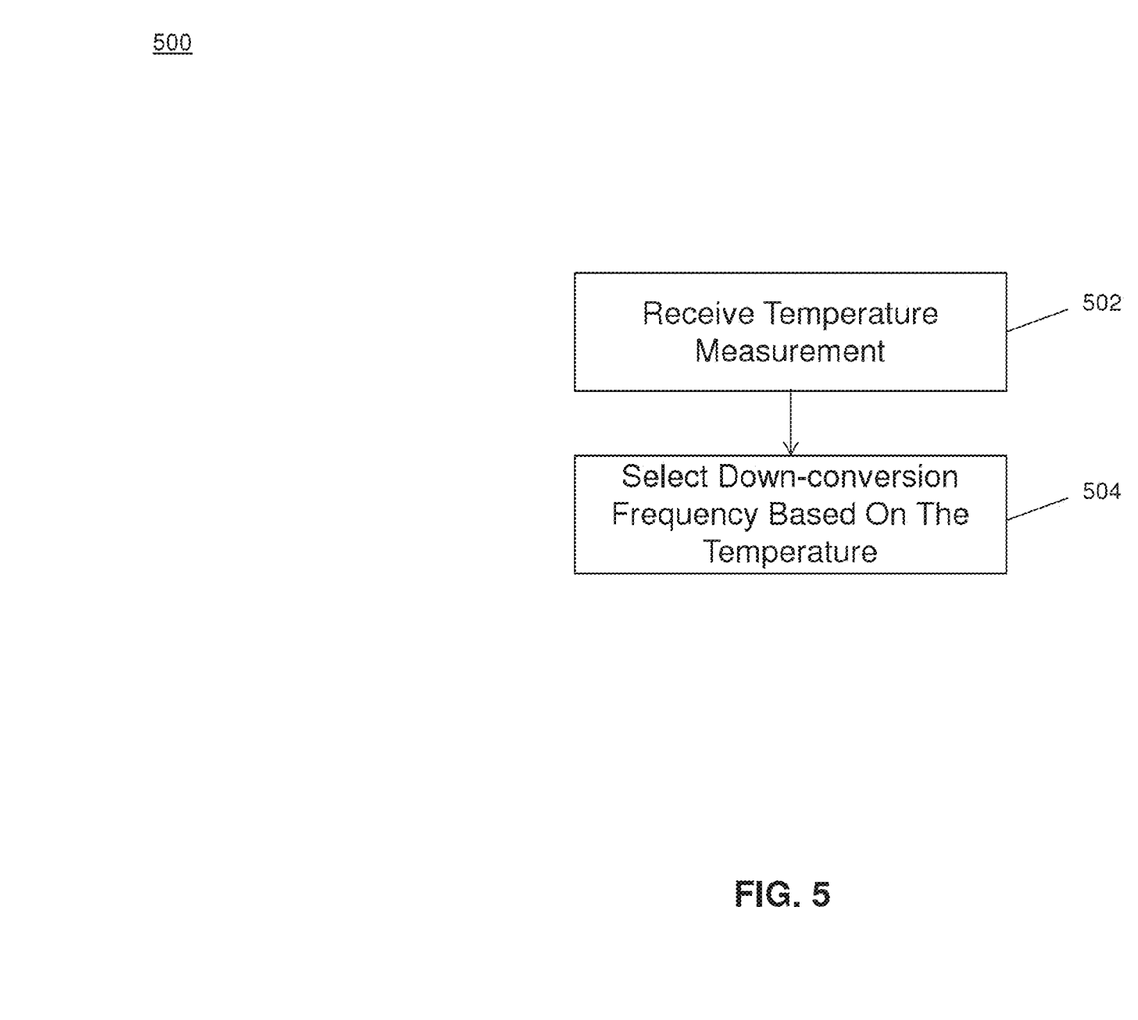
FIG. 5 illustrates an example process for performing temperature compensation for a filter according to various examples.

To eliminate or reduce the effects of temperature on antenna LNA filters 100 and 200, a temperature compensation process 500, shown in FIG. 5, can be used. Process 500 can be implemented using an antenna LNA filter similar or identical to filters 100 and 200 above.

At block 502, a temperature measurement can be received. The temperature can represent the operating temperature or the temperature of the filter(s), such as those used in antenna LNA filters 100 and 200. The temperature can be measured by the filter device or can be received from an external temperature measuring device.

At block 504, the temperature received at block 502 can be used to select a down-conversion frequency. The down-conversion frequency can represent frequency of the signal output by MIX 118 or 140 and can be adjusted by changing the frequency of the clock signal output by LO 128 or 150. In these examples, LO 128 and 150 can be adjustable oscillators operable to output clock signals having frequencies within a desired range. The down-conversion frequency can be selected such that the down-converted signal properly falls within the shifted frequency response of the filter(s). For example, if the temperature received at block 502 is lower than a normal operating temperature, then the frequency response of the filter can be shifted toward higher frequencies, as shown in FIG. 4 (or toward lower frequencies for other filters). To compensate for this shift, the GNSS signal can be down-converted to a frequency that is higher than the down-conversion frequency used at normal operating temperatures, thereby causing the down-converted signal to properly fall within the frequency response of the temperature-shifted filter. In some examples, the frequency can be selected using known properties of the filter(s) being used. For example, the frequency response of the filter(s) at various temperatures can be determined and a table-lookup, mathematical model, or the like, can be used to determine an appropriate down-conversion frequency for the particular filter at any given temperature. In some examples, the following equation can be used to determine the oscillator frequency (e.g., LO_1 or LO_2) used for down-conversion:

$$F_{LO} = F_O + (T_A - 20) * K$$

$F_{LO}$ Frequency of the Local Oscillator at temperature $T_A$
$F_O$ Frequency of the Local Oscillator at temperature +20° C.
$T_A$ Ambient temperature K Temperature factor (measured value) of the intermediate frequency filter(s) (e.g., filter 122, 126, 144, or 148)

This equation can be used to model the change of central frequency of the intermediate filters due to change in temperature for each band (e.g., L1 and L2/L5).

In some examples, process 500 can be performed in conjunction with process 300, described above. For example, process 500 can be performed at or before block 302 of process 300. The down-conversion frequency determined at block 504 of process 500 can be used as the down-conversion frequency used at block 302 of process 300.

Figure 6:
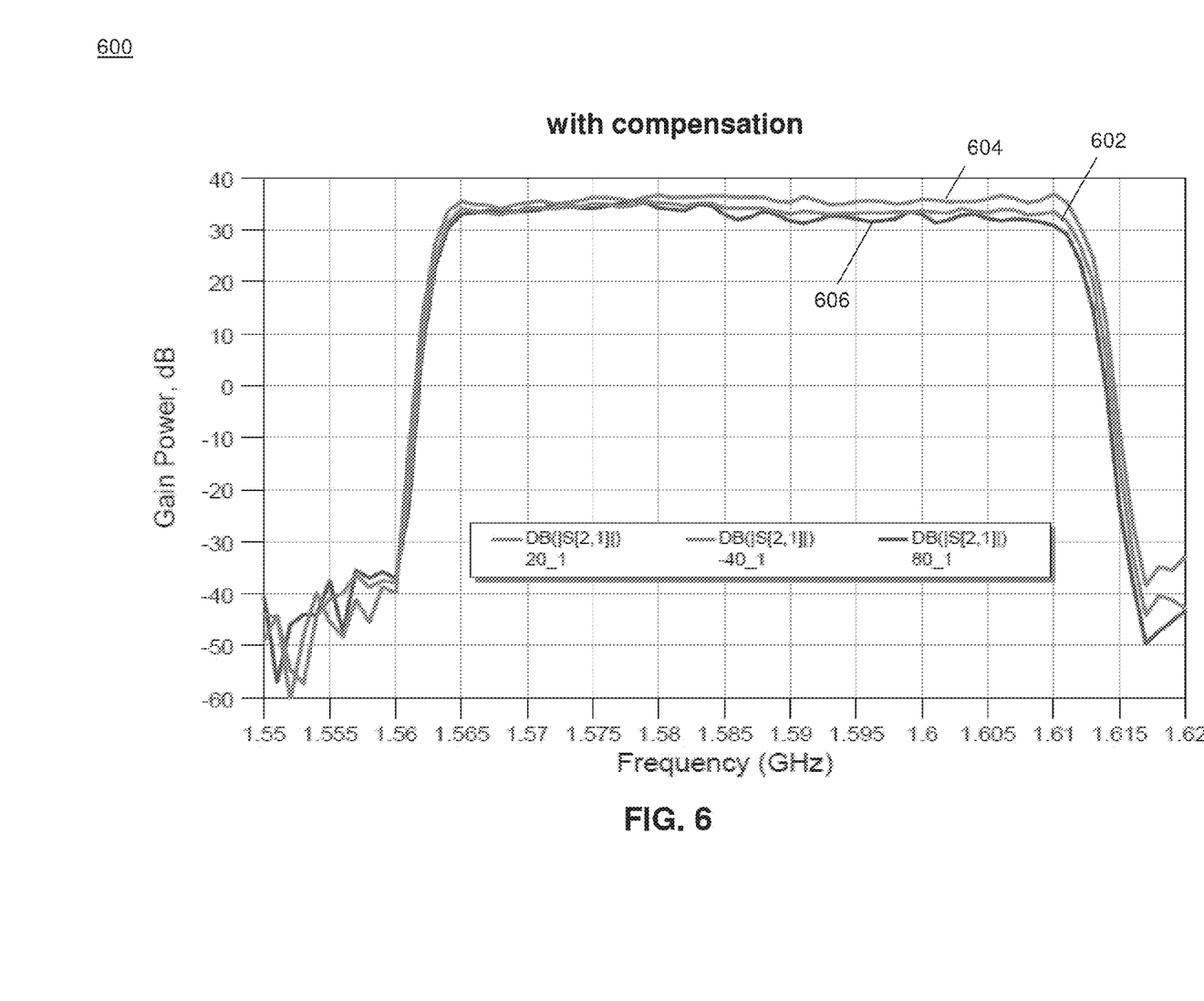
FIG. 6 is a graph showing the frequency response of an LNA filter implementing temperature compensation according to various examples.

Using processes 300 and 500, a compensated frequency response of the filter can be obtained. For example, FIG. 6 illustrates a graph 600 of an example filter implementing processes 300 and 500 at various operating temperatures. In particular, curve 602 represents the frequency response of the filter at 20° C., curve 604 represents the frequency response of the filter at −40° C., and curve 606 represents the frequency response of the filter at 80° C. As can be seen, the frequency response of the filter is much more uniform over the various temperatures than that shown in FIG. 4.

Figure 7:
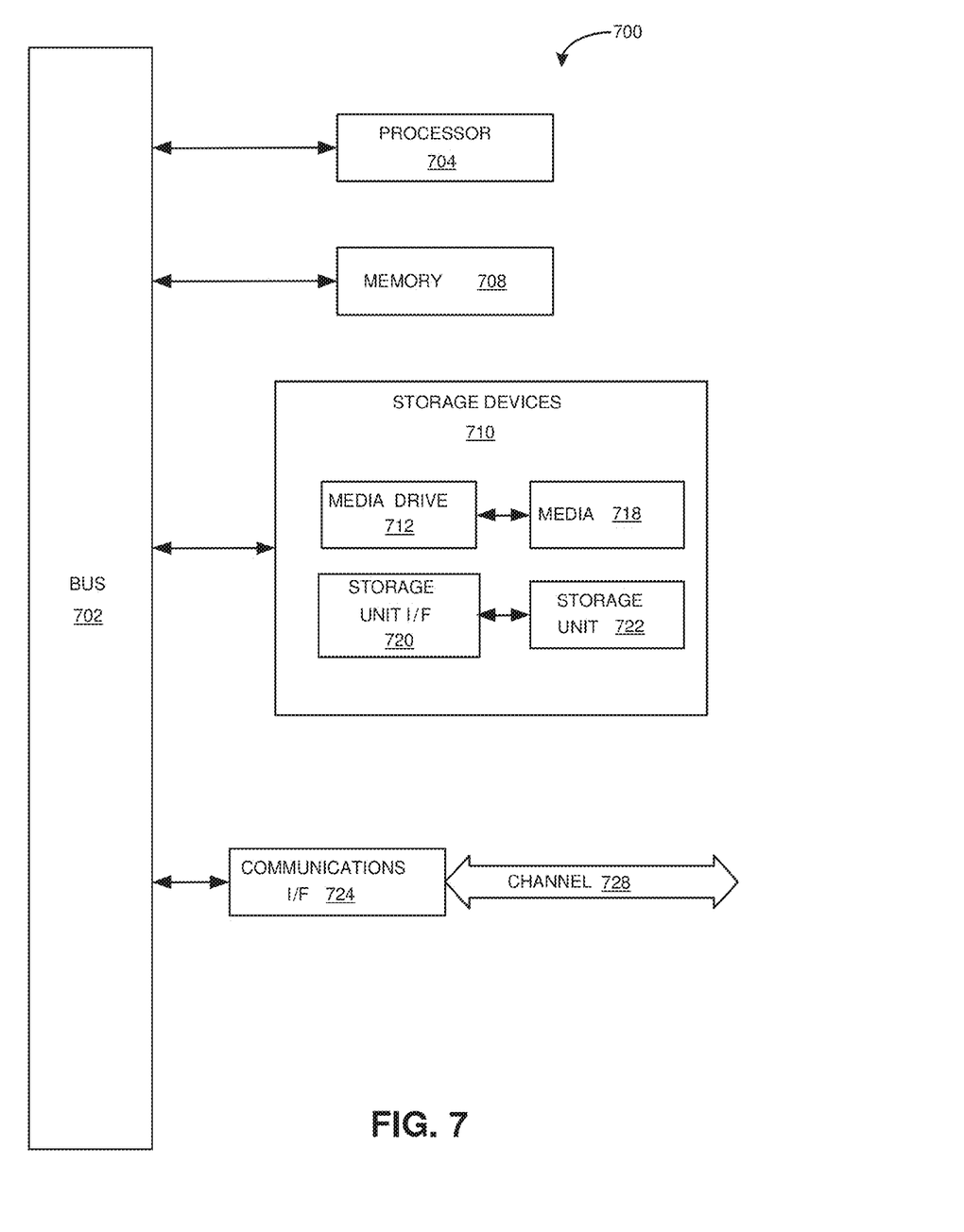
FIG. 7 illustrates a typical computing system that may be employed to implement some or all processing functionality in certain examples.

FIG. 7 illustrates a typical computing system 700 that may be employed to implement processing functionality in various examples. Computing system 700 can include one or more processors, such as a processor 704. Processor 704 can be implemented using a general or special purpose processing engine such as, for example, a microprocessor, microcontroller or other control logic. In this example, processor 704 is connected to a bus 702 or other communication medium.

Computing system 700 may also include a main memory 708, such as random access memory (RAM) or other dynamic memory, for storing information and instructions to be executed by processor 704. Main memory 708 also may be used for storing temporary variables or other intermediate information during execution of instructions to be executed by processor 704. Computing system 700 may likewise include a read only memory ("ROM") or other static storage device coupled to bus 702 for storing static information and instructions for processor 704.

The computing system 700 may also include information storage system 710, which may include, for example, a media drive 712 and a removable storage interface 720. The media drive 712 may include a drive or other mechanism to support fixed or removable storage media, such as a hard disk drive, a floppy disk drive, a magnetic tape drive, an optical disk drive, a CD or DVD drive (R or RW), or other removable or fixed media drive. Storage media 718 may include, for example, a hard disk, floppy disk, magnetic tape, optical disk, CD or DVD, or other fixed or removable medium that is read by and written to by media drive 712. As these examples illustrate, the storage media 718 may include a computer-readable storage medium having stored therein particular computer software or data.

In other examples, information storage system 710 may include other similar components for allowing computer programs or other instructions or data to be loaded into computing system 700. Such components may include, for example, a removable storage unit 722 and an interface 720, such as a program cartridge and cartridge interface, a removable memory (for example, a flash memory or other removable memory module) and memory slot, and other removable storage units 722 and interfaces 720 that allow software and data to be transferred from the removable storage unit 718 to computing system 700.

Computing system 700 may also include a communications interface 724. Communications interface 724 can be used to allow software and data to be transferred between computing system 700 and external devices. Examples of communications interface 724 can include a modem, a network interface (such as an Ethernet or other NIC card), a communications port (such as for example, a USB port), a PCMCIA slot and card, etc. Software and data transferred via communications interface 724 are in the form of signals which can be electronic, electromagnetic, optical or other signals capable of being received by communications interface 724. These signals are provided to communications interface 724 via a channel 728. This channel 728 may carry signals and may be implemented using a wireless medium, wire or cable, fiber optics, or other communications medium. Some examples of a channel include a phone line, a cellular phone link, an RF link, a network interface, a local or wide area network, and other communications channels.

In this document, the terms "computer program product," "non-transitory computer-readable storage medium" and the like may be used generally to refer to physical, tangible media such as, for example, memory 708, storage media 718, or storage unit 722. These and other forms of non-transitory computer-readable storage media may be involved in storing one or more instructions for use by processor 704, to cause the processor to perform specified operations. Such instructions, generally referred to as "computer program code" (which may be grouped in the form of computer programs or other groupings), when executed, enable the computing system 700 to perform features or functions of various examples. Note that the code may directly cause the processor to perform specified operations, be compiled to do so, or be combined with other software, hardware, or firmware elements (e.g., libraries for performing standard functions) to do so.

In an embodiment where the elements are implemented using software, the software may be stored in a non-transitory computer-readable storage medium and loaded into computing system 700 using, for example, removable storage media 718, drive 712, or communications interface 724. The control logic (in this example, software instructions or computer program code), when executed by the processor 704, causes the processor 704 to perform the functions of the examples described herein (e.g., processes 300 and 500 shown in FIGS. 3 and 5).

It will be appreciated that the above description for clarity has described examples reference to different functional units. However, it will be apparent that any suitable distribution of functionality between different functional units may be used without detracting from the present technology. Hence, references to specific functional units are only to be seen as references to suitable means for providing the described functionality rather than indicative of a strict logical or physical structure or organization.

The various examples can be implemented in any suitable form including hardware, software, firmware or any combination thereof. Different aspects of the present disclosure may be implemented at least partly as computer software or firmware running on one or more data processors or digital signal processors. The elements and components of an example of the present disclosure may be physically, functionally and logically implemented in any suitable way. Indeed the functionality may be implemented in a single unit, in a plurality of units or as part of other functional units. As such, the various examples may be implemented in a single unit or may be physically and functionally distributed between different units and processors.

What is claimed is:

1. A low-noise amplifier (LNA) filter comprising:
a temperature sensor for detecting a temperature of the LNA filter;
a first stage coupled to receive a GNSS signal from a first antenna, wherein the first stage is configured to at least partially filter portions of the GNSS signal outside of a first frequency band, and wherein the GNSS signal has a signal frequency equal to an original frequency value within the first frequency band;
a second stage coupled to receive the GNSS signal from the first stage, wherein the second stage is configured to:
down-convert the frequency of the GNSS signal to a first value lower than the original frequency value, wherein the first value is within a second frequency band and the first value is based at least in part on the temperature of the LNA filter detected by the temperature sensor; and
at least partially filter portions of the down-converted GNSS signal outside of the second frequency band, wherein the second frequency band has a frequency range corresponding to a frequency range of the first frequency band after down-converting; and
a third stage coupled to receive the down-converted GNSS signal from the second stage, wherein the third stage is configured to up-convert the frequency of the GNSS signal to the original frequency value.

2. The LNA filter of claim 1 further comprising:
a fourth stage coupled to receive the GNSS signal from a second antenna, wherein the fourth stage is configured to at least partially filter portions of the GNSS signal outside of a third frequency band;
a fifth stage coupled to receive the GNSS signal from the fourth stage, wherein the fifth stage is configured to:
down-convert the frequency of the GNSS signal to a second value lower than the original frequency value; and
at least partially filter portions of the down-converted GNSS signal outside of a frequency band corresponding to the third frequency band; and
a sixth stage coupled to receive the down-converted GNSS signal from the fifth stage, wherein the sixth stage is configured to up-convert the frequency of the GNSS signal to the original frequency value.

3. The LNA filter of claim 2, wherein the first antenna and the second antenna are the same antenna.

4. The LNA filter of claim 2, wherein the fourth stage comprises:
a second ceramic filter coupled to receive the GNSS signal from the second antenna;
a second LNA circuit coupled to receive an output of the second ceramic filter; and
a third ceramic filter coupled to receive an output of the second LNA filter.

5. The LNA filter of claim 2, wherein the fifth stage comprises:
a third mixing circuit coupled to receive the GNSS signal from the first stage and a third clock signal from a third oscillator, wherein the third mixing circuit is configured to down-convert the frequency of the GNSS signal to the value lower than the original frequency value;
a third IFA circuit coupled to receive the down-converted GNSS signal from the third mixing circuit;
a fifth SAW filter coupled to receive an output of the third IFA circuit;
a fourth IFA circuit coupled to receive an output of the fifth SAW filter; and
a sixth SAW filter coupled to receive an output of the fourth IFA circuit.

6. The LNA filter of claim 2, wherein the sixth stage comprises:
a fourth mixing circuit coupled to receive the down-converted GNSS signal from the second stage and a fourth lock signal from a fourth oscillator, wherein the fourth mixing circuit is configured to up-convert the frequency of the GNSS signal to the original frequency value; and
a fourth ceramic filter coupled to receive up-converted GNSS signal from the fourth mixing circuit.

7. The LNA filter of claim 1, wherein the first stage comprises:
a first surface acoustic wave (SAW) filter coupled to receive the GNSS signal from the first antenna;
a first LNA circuit coupled to receive an output of the first SAW filter; and
a second SAW filter coupled to receive an output of the first LNA filter.

8. The LNA filter of claim 1, wherein the second stage comprises:
a first mixing circuit coupled to receive the GNSS signal from the first stage and a first clock signal from a first oscillator, wherein the first mixing circuit is configured to down-convert the frequency of the GNSS signal to the value lower than the original frequency value;
a first intermediate frequency amplifier (IFA) circuit coupled to receive the down-converted GNSS signal from the first mixing circuit;
a third SAW filter coupled to receive an output of the first IFA circuit;
a second IFA circuit coupled to receive an output of the third SAW filter; and
a fourth SAW filter coupled to receive an output of the second IFA circuit.

9. The LNA filter of claim 1, wherein the third stage comprises:
a second mixing circuit coupled to receive the down-converted GNSS signal from the second stage and a second clock signal from a second oscillator, wherein the second mixing circuit is configured to up-convert the frequency of the GNSS signal to the original frequency value; and
a first ceramic filter coupled to receive up-converted GNSS signal from the second mixing circuit.

10. A method for filtering a global navigation satellite system (GNSS) signal, the method comprising:
detecting a temperature of a low-noise amplifier (LNA) filter by a temperature sensor;
receiving, at a first stage of the LNA filter, a GNSS signal from a first antenna having a signal frequency equal to an original frequency value within a first frequency band;
down-converting, by a second stage of the LNA filter, the frequency of the GNSS signal to a value lower than the original frequency value, wherein the value is within a second frequency band and the value is based at least in part on the temperature of the LNA filter detected by the temperature sensor;
at least partially filtering, by the second stage of the LNA filter, the down-converted GNSS signal outside of the second frequency band, wherein the second frequency band has a frequency range corresponding to a frequency range of the first frequency band after down-converting; and up-converting, by a third stage of the LNA filter, the frequency of the GNSS signal to the original frequency value.

11. The method claim 10 further comprising at least partially filtering portions of the up-converted GNSS signal outside of a third frequency band.

12. The method claim 10 further comprising, after receiving the GNSS signal and before down-converting the GNSS signal, at least partially filtering portions of the GNSS signal outside of the first frequency band.

13. The method claim 10, wherein the GNSS signal comprises information transmitted on an L1, L2, or L5 band.

14. The method claim 10, wherein:
the first stage comprises:
   a first surface acoustic wave (SAW) filter coupled to receive the GNSS signal from a first antenna;
   a first LNA circuit coupled to receive an output of the first SAW filter; and
   a second SAW filter coupled to receive an output of the first LNA filter;
the second stage comprises:
   a first mixing circuit coupled to receive the GNSS signal from the first stage and a first clock signal from a first oscillator, wherein the first mixing circuit is configured to down-convert the frequency of the GNSS signal to the value lower than the original frequency value;
   a first intermediate frequency amplifier (IFA) circuit coupled to receive the down-converted GNSS signal from the first mixing circuit;
   a third SAW filter coupled to receive an output of the first IFA circuit;
   a second IFA circuit coupled to receive an output of the third SAW filter; and
   a fourth SAW filter coupled to receive an output of the second IFA circuit; and
the third stage comprises:
   a second mixing circuit coupled to receive the down-converted GNSS signal from the second stage and a second clock signal from a second oscillator, wherein the second mixing circuit is configured to up-convert the frequency of the GNSS signal to the original frequency value; and
   a first ceramic filter coupled to receive up-converted GNSS signal from the second mixing circuit.

15. The method claim 10, wherein:
the first stage comprises:
   a second ceramic filter coupled to receive the GNSS signal from a second antenna;
   a second LNA circuit coupled to receive an output of the second ceramic filter; and
   a third ceramic filter coupled to receive an output of the second LNA filter;
the second stage comprises:
   a third mixing circuit coupled to receive the GNSS signal from the first stage and a third clock signal from a third oscillator, wherein the second mixing circuit is configured to down-convert the frequency of the GNSS signal to the value lower than the original frequency value;
   a third IFA circuit coupled to receive the down-converted GNSS signal from the third mixing circuit;
   a fifth SAW filter coupled to receive an output of the third IFA circuit;
   a fourth IFA circuit coupled to receive an output of the fifth SAW filter; and
   a sixth SAW filter coupled to receive an output of the fourth IFA circuit; and
the third stage comprises:
   a fourth mixing circuit coupled to receive the down-converted GNSS signal from the second stage and a fourth clock signal from a fourth oscillator, wherein the fourth mixing circuit is configured to up-convert the frequency of the GNSS signal to the original frequency value; and
   a fourth ceramic filter coupled to receive up-converted GNSS signal from the fourth mixing circuit.

* * * * *